(12) United States Patent
Naoe et al.

(10) Patent No.: US 7,668,467 B2
(45) Date of Patent: Feb. 23, 2010

(54) DEMODULATION CIRCUIT, IC, AND COMMUNICATION DEVICE

(75) Inventors: Hitoshi Naoe, Nara (JP); Fumihiro Fukae, Sakurai (JP); Koji Sakai, Osaka (JP); Shohei Ohsawa, Tenri (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 447 days.

(21) Appl. No.: 11/772,879

(22) Filed: Jul. 3, 2007

(65) Prior Publication Data
US 2008/0013963 A1   Jan. 17, 2008

(30) Foreign Application Priority Data
Jul. 14, 2006   (JP) .............................. 2006-194902

(51) Int. Cl.
*H04B 10/06* (2006.01)
(52) U.S. Cl. ....................................... 398/202; 398/208
(58) Field of Classification Search ................. 398/202, 398/208
See application file for complete search history.

(56) References Cited

U.S. PATENT DOCUMENTS

| | | | |
|---|---|---|---|
| 5,187,357 A * | 2/1993 | Watanabe ................. | 250/206.1 |
| 6,154,487 A * | 11/2000 | Murai et al. ................. | 375/150 |
| 6,297,802 B1 | 10/2001 | Fujioka | |
| 6,850,709 B1 | 2/2005 | Gfeller et al. | |

FOREIGN PATENT DOCUMENTS

| | | |
|---|---|---|
| JP | 5-11150 A | 1/1993 |
| JP | 10-98435 A | 4/1998 |
| JP | 2002-535873 A | 10/2002 |

OTHER PUBLICATIONS

"Infrared Data Asscociation Serial Infrared Physical Layer Specification", Version 1.4, (IrDA Serial Infrared Physical Layer Specification, Version 1.4, Feb. 6, 2001).

* cited by examiner

*Primary Examiner*—Dalzid Singh
(74) *Attorney, Agent, or Firm*—Birch, Stewart, Kolasch & Birch, LLP

(57) ABSTRACT

The demodulation circuit of the present invention is a demodulation circuit, connected with a plurality of light-receiving sections each for receiving an optical signal and converting the signal into a binary pulse signal, operable to select and demodulate a pulse signal out of pulse signals that are supplied from the light-receiving sections, respectively, the demodulation circuit including: a judgment and selection section for detecting timing with which High level and Low level of each of the pulse signals are switched and for selecting at least one pulse signal based on the timing; and a demodulation section for demodulating the pulse signal selected by the judgment and selection section. Consequently, the demodulation circuit easily selects and demodulates a signal whose jitter component is small out of a plurality of supplied signals.

11 Claims, 12 Drawing Sheets

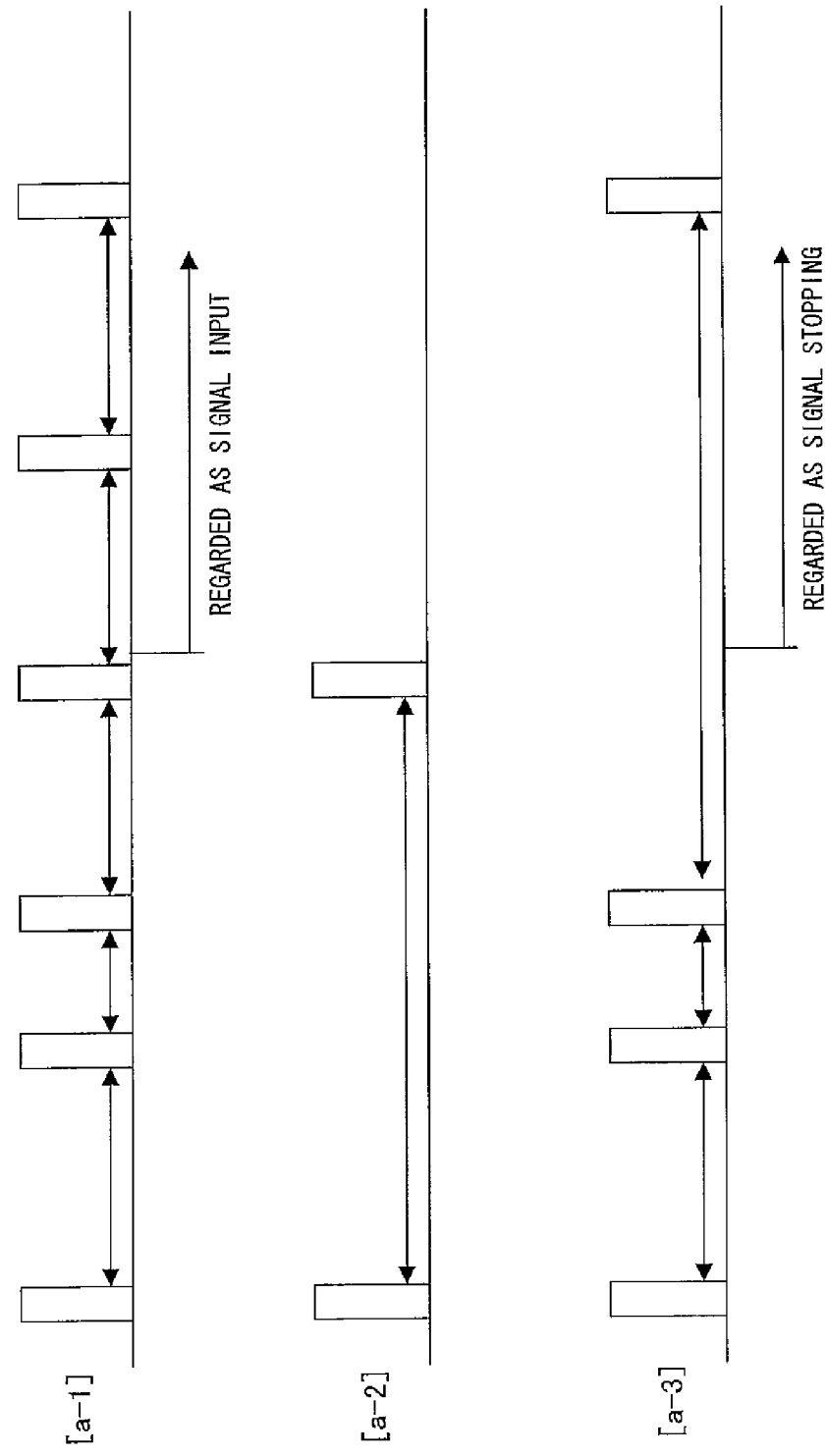

DEMODULATION CIRCUIT, IC, AND COMMUNICATION DEVICE

This non-provisional application claims priority under 35 U.S.C. § 119(a) on Patent Application No. 2006-194902 filed in Japan on Jul. 14, 2006, the entire contents of which are hereby incorporated by reference.

FIELD OF THE INVENTION

The present invention relates to: a demodulation circuit for demodulating a reception signal; and an IC and a communication device including the demodulation circuit.

BACKGROUND OF THE INVENTION

Recently, many devices include infrared communication functions. Infrared communications use light and therefore have high directivity. Accordingly, communications are possible only when light transmitted from a light-emitting section of a communication device at least has light intensity which allows a light-receiving section of another communication device to receive the light in a surveyable range without any obstacles. For that reason, a communication distance and a light-receiving angle of the light communication depend on transmission light intensity and reception light sensitivity.

An example of a standard for specifying a method of infrared communications is IrDA (Infrared Data Association). IrDA standard defines that transmission light intensity is 100 mW/sr or more for a standard device, and reception sensitivity is 10 μW/cm$^2$ or less for the standard device. This allows communications with a distance of 1 meter and an angle of ±15 degrees between the communication devices.

However, it is sometimes requested that optical communications with the above standard are carried out with a light-reception angle of ±45 degrees or more and a distance of 2 meters or more between a mobile device and an installed device (e.g. TV, PC, DVD/HDD recorder, and printer).

In order to extend a communication distance and to widen a light-reception angle, there is a method for increasing transmission light intensity of a communication device. However, in order to obtain a light output of 100 mW/sr specified in IrDA standard, an LED consumes an electric current of approximately 400 mA or more.

For example, in order to extend a communication distance twice, four times as large light output which is a square of a distance ratio is required. Consequently, an LED consumes an electric current of 1.6 A or more, which is a very large amount. This is not an amount of an electric current which can flow in a mobile device driven by a buttery or a device connected via an electricity-saving AC adaptor.

Furthermore, if the large amount of an electric current flows, more amount of heat is generated, and accordingly a protection against the heat is required. Consequently, the communication device must have a structure against the heat, resulting in a larger size. When a smaller device is required in the case of mobile phones, a communication device in a larger size is against the original intention.

As described above, it is difficult to increase transmission light intensity of a communication device, and therefore it is necessary to increase reception sensitivity of the communication device. In order to extend a communication distance and to widen a light-reception angle, there is a technique to provide a lens of large diameter.

However, when the baud rate of optical communications is high, it is requested that a photodiode or a phototransistor is small or a large bias voltage is applied on the photodiode or the phototransistor. Normally, applying a large bias voltage leads to cost up of a whole system.

For that reason, a small photodiode or a small phototransistor is mounted for high-speed communications. However, in a case of a lens of large diameter, light flux incident to the lens from all directions is required to be converged on the photodiode or the phototransistor, which makes an optical design very troublesome.

On the other hand, another method for extending a communication distance and widening a light-reception angle is as follows: optical design for narrowing a light-reception angle is carried out so as to extend a communication distance, and a plurality of optical communication devices are mounted so as to widen a light-reception angle. The following technique is disclosed as a method for mounting a plurality of optical communication devices.

For example, Japanese Unexamined Patent Publication No. 11150/1993 (Tokukaihei 05-11150; published on Jan. 19, 1993) (Document 1) discloses a technique in which: electric signals converted from optical signals received by optical communication devices are subjected to a logical disjunction, and an electric signal obtained by the logical disjunction is regarded as a reception signal. The electric signal obtained by the logical disjunction is supplied to a signal process circuit and is demodulated.

Furthermore, Japanese Unexamined Patent Publication No. 98435/1998 (Tokukaihei 10-98435; published on Apr. 14, 1998) (Document 2) discloses a technique in which: light-receiving sections of optical communication devices which receive transmission optical signals are switched by a switch so that a light-receiving section is selected. A reception signal supplied via the selected light-receiving section is demodulated.

Furthermore, Japanese Unexamined Patent Publication No. 535873/2002 (Tokukai 2002-535873; published on Oct. 22, 2002) (Document 3) discloses a technique in which: optical signals supplied from light-receiving sections of optical communication devices are converted into digital signals, synchronization signals called preambles positioned at the head of the digital signals for PLL synchronization are used to detect changes in pulse width or pulse position of the preambles, thereby determining and comparing measurement indicative of intensity of the supplied optical signals. As a result of the comparison, a digital signal having measurement expected to be appropriate for a subsequent process is selected.

However, Document 1 has a problem as follows: in a case of a sufficiently slow optical signal, demodulation of the electric signal subjected to the logical disjunction can be carried out without any problem. However, assume a case where an optical signal converted from an original signal is a fast signal having more than several Mbps. At that time, out of electric signals converted from optical signals, an electric signal supplied from an optical communication device to which particularly weak light is supplied has a large jitter depending on intensity of light incident to optical communication devices.

The electric signal having the jitter is subjected to the logical disjunction, resulting in an electric signal having so large jitter that a signal processing circuit cannot process the jitter. Consequently, demodulation of the electric signal becomes difficult. As a result, communications are allowed only in an area narrower than the actual communicable area.

Furthermore, in Document 2, a transmission request signal is sent to a transmitter so as to switch light-receiving sections of optical communication devices. This results in communication loss. Furthermore, as light-receiving sections are switched by confirming the direction of the transmitter in accordance with a response signal from the transmitter, when the transmitter moves during communications, the communications may be broken down.

Furthermore, in Document 3, preambles are used not only for PLL synchronization, but also for stabilization of reception sensitivity of a photodiode or a phototransistor. Consequently, a pulse width or a pulse position of the preambles change regardless of light intensity, and accordingly it is impossible to judge whether the change is due to light intensity or not.

When light intensity is judged after stabilization of the change, a plurality of pulses are required. Consequently, it is uncertain whether pulses can be supplied sufficiently for PLL synchronization. On the other hand, it is possible to lengthen a preamble. However, this causes reduction of an effective band of communications and requires all transmitters to be designed to be capable of lengthening a preamble. For that reason, in reality, lengthening of a preamble is not carried out.

SUMMARY OF THE INVENTION

The present invention was made in view of the foregoing problems. An object of the present invention is to provide a demodulation circuit, an IC, and a communication device, each easily capable of selecting and demodulating a signal whose jitter component is small out of a plurality of supplied signals.

In order to solve the foregoing problems, the demodulation circuit of the present invention is a demodulation circuit, connected with a plurality of light-receiving sections each for receiving an optical signal and converting the signal into a binary pulse signal, operable to select and demodulate a pulse signal out of pulse signals that are supplied from the light-receiving sections, respectively, the demodulation circuit including: judgment and selection means for detecting timing with which High level and Low level of each of the pulse signals are switched and for selecting at least one pulse signal based on the timing; and demodulation means for demodulating the pulse signal selected by the judgment and selection means.

With the arrangement, the judgment and selection means detects timing with which High level and Low level of each of the pulse signals that are supplied from the light-receiving sections, respectively, are switched, and the judgment and selection means selects at least one pulse signal based on the timing. Thus, timing with which High level and Low level are switched is detected and judged. Consequently, it is possible to select and demodulate a pulse signal, not with respect to the plurality of light-receiving sections, but with respect to the plurality of pulse signals.

Consequently, it is possible to select a pulse signal appropriate for demodulation, that is, a pulse signal whose jitter component is small, with respect to the pulse signals. Further, because the judgment and selection means selects a pulse signal based on timing with which High level and Low level of each of the pulse signals are switched, it is possible to easily select a pulse signal. Further, because the judgment and selection means selects a pulse signal, it is possible for the demodulation means to demodulate the selected pulse signal without adding jitter components that are included in respective pulse signals.

Therefore, the demodulation circuit of the present invention can easily select and demodulate a pulse signal whose jitter component is small out of the plurality of pulse signals.

Further, because the judgment and selection means only detects switching of High level and Low level of a pulse signal in selecting a pulse signal to be demodulated. Therefore, it is unnecessary to provide, at a stage prior to the demodulation circuit, a circuit for processing a pulse signal so that the pulse signal becomes appropriate for demodulation. Consequently, it is possible to reduce a delay time from the time when the light-receiving section receives an optical signal to the time when the signal is supplied to the demodulation circuit.

Further, even if a source for generating a transmission signal (a transmitter such as a mobile phone) moves in the course of communications, communication breakdown can be prevented because the judgment and selection means identifies a signal to be demodulated, not with respect to the plurality of light-receiving sections but with respect to the plurality of pulse signals.

Further, the IC of the present invention includes the demodulation circuit.

With the arrangement, the demodulation circuit or the demodulation circuit and its periphery circuitry can be easily realized by using ICs.

Further, the communication device of the present invention includes the demodulation circuit and a plurality of light-receiving sections each for receiving an optical signal, converting the signal into a binary pulse signal, and supplying the pulse signal to the demodulation circuit.

With the arrangement, after receiving an optical signal, the communication device must demodulate the optical signal so as to process the signal as data in the communication device. Because the communication device of the present invention includes the demodulation circuit, the communication device can select and properly demodulate a pulse signal out of pulse signals that are supplied from the light-receiving sections, respectively, for receiving an optical signal and converting the signal into a binary pulse signal. Therefore, it is possible to restore the optical signal to original data without errors.

For a fuller understanding of the nature and advantages of the invention, reference should be made to the ensuing detailed description taken in conjunction with the accompanying drawings.

BRIEF DESCRIPTION OF THE DRAWINGS

FIG. 12 is a drawing showing intervals at which input pulses are generated.

DESCRIPTION OF THE EMBODIMENTS

Embodiment 1

Figure 1:
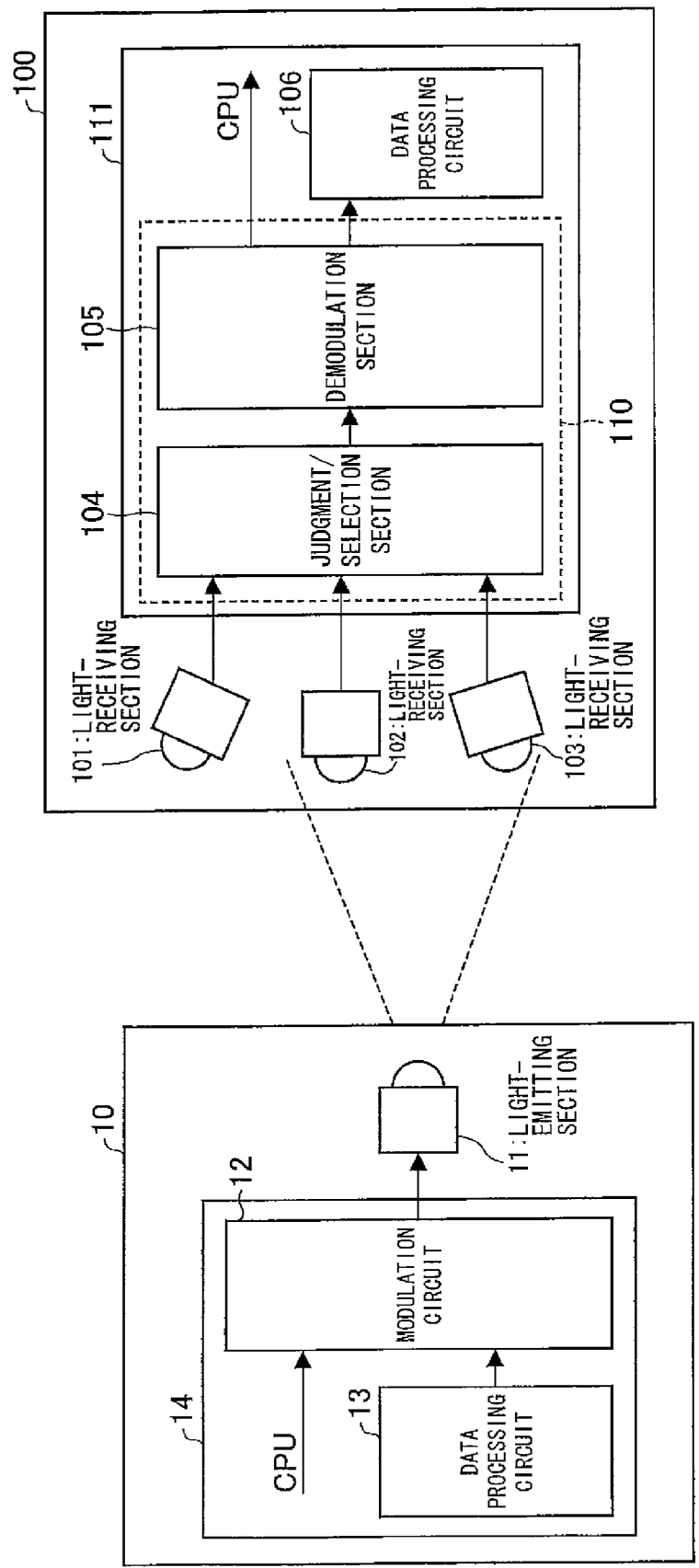
FIG. 1 is a block diagram schematically showing structures of: a receiver including a demodulation circuit of an embodiment of the present invention; and a transmitter.

The following explains an embodiment of the present invention with reference to FIGS. 1 to 7. FIG. 1 is a block diagram showing communications between a transmitter 10 and a receiver 100 including light-receiving sections 101 to 103. The transmitter 10 and the receiver 100 include user interfaces such as a display section and an operation section, CPUs, and memories which are irrelevant to the subject matters of the present invention and therefore are omitted in the drawings.

The transmitter 10 and the receiver 100 in the following explanation include an optical communication function. A general communication method using an infrared ray (e.g. IrDA) is used in the present embodiment. However, the present invention is not limited to this. The present invention is applicable to optical communication methods for visible light communications using light other than an infrared ray, and to wireless communication methods using radio waves having high directivity.

With reference to FIG. 1, the following explains a structure and an operation of the transmitter 10 which transmits an optical signal to the receiver 100.

The transmitter 10 includes a light-emitting section 11 and a transmission circuit 14. The transmission circuit 14 includes a modulation circuit 12 and a data processing circuit 13.

In the transmitter 10, when a data transmission request comes from a user interface (not shown), a CPU (not shown) generates data to be transmitted, or reads, from a memory (not shown), data to be transmitted. Thus, data is prepared.

The CPU converts the prepared data into data in a transmission format (hereinafter referred to as "packet data") and supplies the packet data to the modulation circuit 12 (the supply is indicated by the upper arrow mark in the transmission circuit 14). Alternatively, the CPU supplies the prepared data to the data processing circuit 13. The data processing circuit 13 converts the supplied data into packet data and supplies the packet data to the modulation circuit 12.

As described above, the CPU may supply the prepared data directly to the data processing circuit 13, or may supply the packet data obtained by the conversion to the modulation circuit 12. Furthermore, DMA (Direct Memory Access) may be used for data transfer.

DMA carries out, without the CPU, data transfer between a Peripheral (devices other than the CPU and memory systems) and a memory, between memories, and between Peripherals.

For example, the DMA transfers data from the memory to the data processing circuit 13 or to the modulation circuit 12, and the DMA transfers data from the data processing circuit 13 or from the modulation circuit 12 to the memory.

In order to convert the supplied packet data into an optical signal and transmit the optical signal, the modulation circuit 12 modulates the supplied packet data into serial data appropriate for transmission, and supplies the serial data to the light-emitting section 11. The light-emitting section 11 converts the supplied serial data from an electric signal into an optical signal, and the transmitter 10 transmits the serial data as light to outside.

The receiver 100 receives the light (optical signal) transmitted from the transmitter 10, thereby receiving a signal including the data.

With reference to FIG. 1, the following explains a structure of the receiver 100 which receives light via the light-receiving sections 101 to 103.

The receiver 100 of the present embodiment includes the light-receiving sections 101 to 103 and a reception circuit 111. In the receiver 100, the light-receiving sections 101 to 103 receive optical signals from the transmitter 10 and convert the optical signals into electric signals, and supply the electric signals as digital signals to the reception circuit 111. The reception circuit 111 restores the digital signal to data before transmission by the transmitter 10.

The light-receiving sections 101 to 103 receive optical signals, convert the optical signals into electric signals (digital signals), and supply the digital signals (pulse signals) to the reception circuit 111. FIG. 1 shows three light-receiving sections 101 to 103. However, the number of the light-receiving sections is not limited to three. It is desirable that the number ranges from two to ten or so. The number may be changed in accordance with costs.

FIG. 1 shows the light-receiving sections 101 to 103 which are positioned on a straight line. However, the positioning is not limited to this. Basically, it is desirable to position the light-receiving sections on a circle. By positioning the light-receiving sections on a circle, it is possible to widen a light-receiving angle as a whole.

Furthermore, it is desirable that the light-receiving sections 101 to 103 are positioned so that light-receiving angles of respective light-receiving sections overlap with each other a little. For example, in a case where a light-receiving angle of each light-receiving section is ±20 degrees, the light-receiving sections are positioned so that the angle between light-receiving directions is 30 degrees. As a result, areas each defined by a light-receiving angle of the light-receiving section overlap with each other by 5 degrees. Consequently, it is possible to widen a light-receivable angle as a whole without making an area incapable of receiving light.

Furthermore, it is possible to lengthen a communication distance by narrowing a light-receiving angle of the light-receiving sections 101 to 103. Basically, although the communication distance is influenced by SN ratio, the communication distance is inversely proportional to a communicable area (a solid angle in which communications with a transmitter are possible). Therefore, in order to double the communication distance, it is necessary to make the communicable area half. For example, in a case where the original light-receiving angle is ±15 degrees, narrowing the light-receiving angle to ±10 degrees would make the communication distance approximately twice.

Which is more preferable out of lengthening of the communication distance and widening of the light-receiving angle is to be decided depending on environmental conditions under which the receiver 100 is used.

Figure 2:
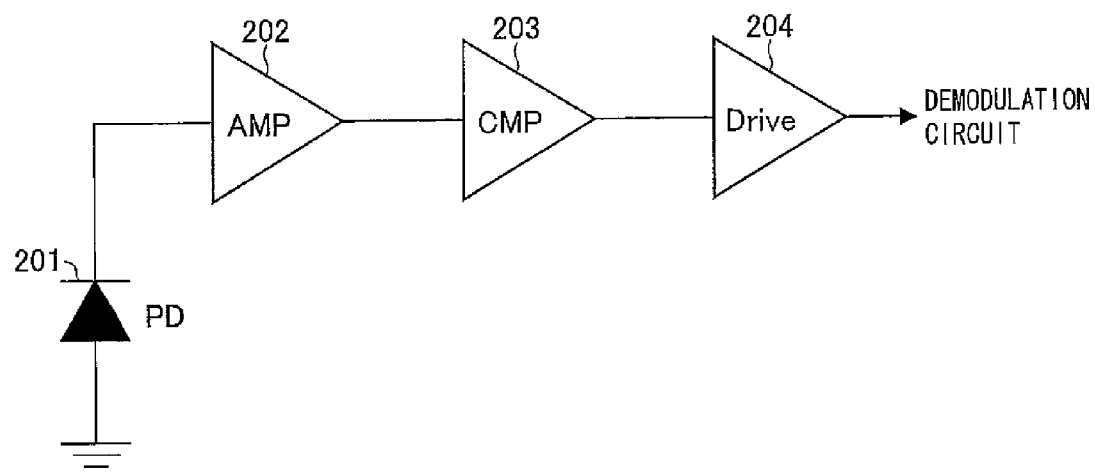
FIG. 2 is a block diagram showing a structure of a light-receiving section in the receiver.

With reference to FIG. 2, the following explains a basic structure and operation of the light-receiving sections 101 to 103. FIG. 2 is a block diagram showing a structure example of the light-receiving sections 101 to 103. Explanations will be made as to the light-receiving section 101, but the same explanations can be said about the light-receiving sections 102 and 103.

As shown in FIG. 2, the light-receiving section 101 includes a photodiode 201, an amplifier 202, a comparator circuit 203, and a drive circuit 204.

The photodiode 201 receives an optical signal and supplies a voltage corresponding to light intensity to the amplifier 202.

That is, an optical signal from the transmitter 10 is converted by the photodiode 201 into an electric signal and is supplied to the amplifier 202.

The amplifier 202 amplifies the supplied voltage and supplies the amplified voltage to the comparator circuit 203. The amplifier 202 normally includes AGC (Auto Gain Control). The AGC allows an amplification ratio to be low in a case where the supplied voltage is high and the AGC allows an amplification ratio to be high in a case where the supplied voltage is low. Consequently, the amplifier 202 maintains substantially the same output voltage even though the supplied voltages differ.

The comparator circuit 203 binarizes the supplied voltage and supplies the voltage to the drive circuit 204. Specifically, when the supplied voltage is more than a predetermined value, the comparator circuit 203 supplies a digital signal indicative of High. On the other hand, when the supplied voltage is less than the predetermined value, the comparator circuit 203 supplies a digital signal indicative of Low. Thus, the comparator circuit 203 binarizes the supplied voltage and supplies the voltage.

The predetermined value is a threshold value set for the comparator circuit 203. The threshold value is ideally a midpoint of an output voltage of the amplifier 202. However, in reality, the threshold value changes, for example, in the middle of pulse. Accordingly, the threshold value is not necessarily limited to the midpoint exactly.

Depending on whether the digital signal indicative of High or Low is received, the drive circuit 204 supplies a digital signal indicative of High or Low to the reception circuit 111 which is positioned outside of the light-receiving section 101, specifically, to a judgment/selection section 104 of a demodulation circuit 110 which will be mentioned later.

The light-receiving sections 101 to 103 are positioned so as to have different light-receiving directions. Consequently, when the light-emitting section 11 of the transmitter 10 transmits an optical signal, the light-receiving sections 101 to 103 receive light with different intensity, depending on where the light-emitting section 11 is positioned.

Ideally, it is desirable that, regardless of light intensity indicated by supplied optical signals (supplied light), electric signals converted from the optical signals are amplified to be the same output waveforms.

However, in a case of weak light, the light-receiving sections 101 to 103 cannot sufficiently amplify electric signals converted from optical signals. Consequently, waveforms after amplification are not necessarily the same. Furthermore, due to distortion of an amplified output signal, it is impossible to carry out appropriate binarization.

Figure 3:
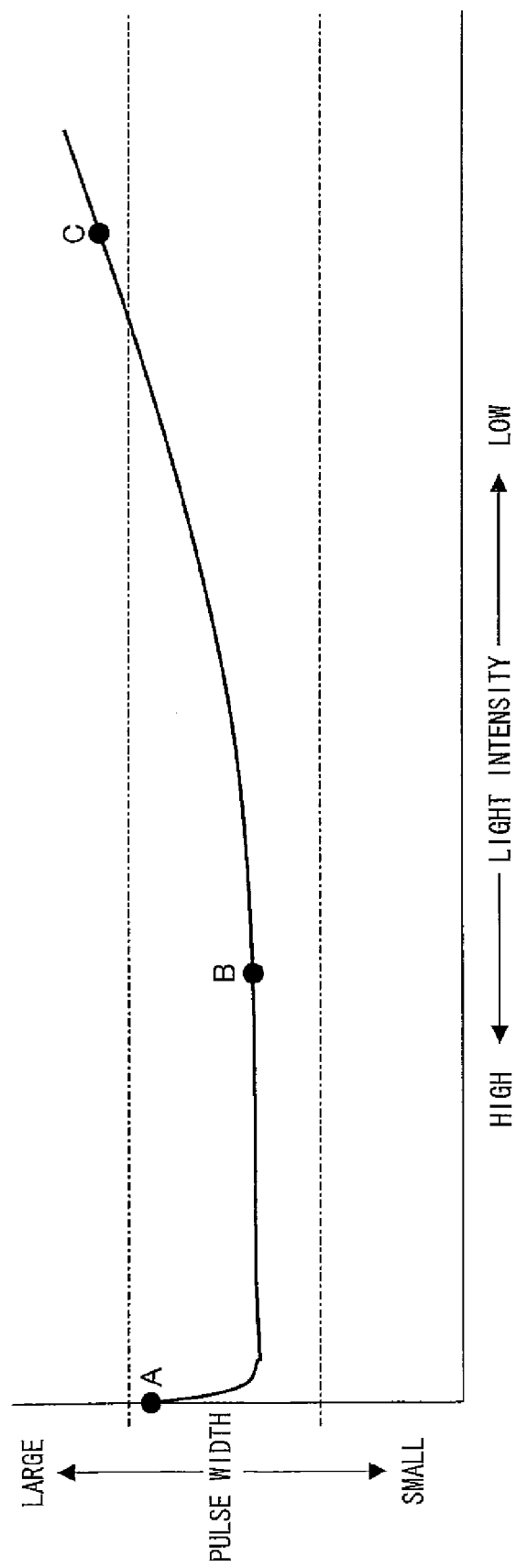
FIG. 3 is a graph showing a relation between light intensity and pulse width.
Figure 4:
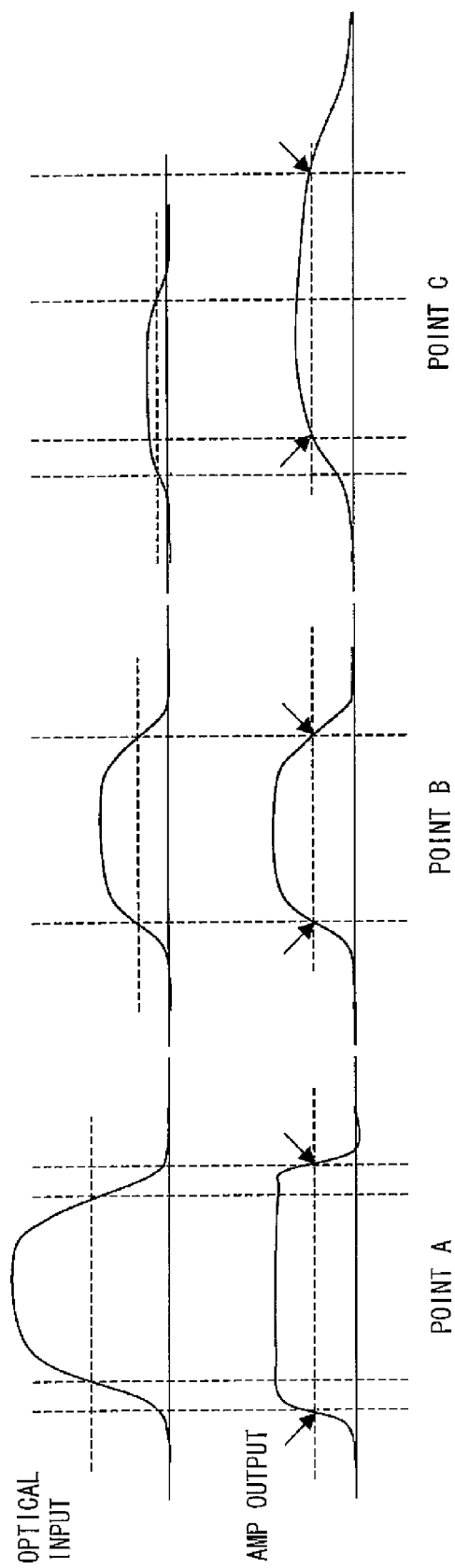
FIG. 4 is a drawing showing output waveforms of an amplifier in response to optical inputs.

With reference to FIGS. 2 to 4, the following specifically explains an amplified output waveform of the light-receiving section 101 in a case where the light-receiving section 101 receives three kinds of optical signals having different light intensity. The following explanation can be said about the light-receiving sections 102 and 103, too.

FIG. 3 is a graph showing a relation between light intensity and a pulse width. The longitudinal axis represents a pulse width and the lateral axis represents light intensity. FIG. 4 is a drawing showing an output waveform of the amplifier 202 in response to supplied light at points A to C shown in FIG. 3.

As shown in FIGS. 3 and 4, in a case where a supplied optical signal is very large (signal represented by the point A), the signal is already beyond the upper limit of the output of the amplifier 202 without being amplified by the amplifier 202. Consequently, the amplifier 202 amplifies only the lower part of the signal and outputs it.

In this case, the pulse width of the output voltage of the amplifier 202 is a width between two points (indicated by arrow marks) where the output waveform intersects the line indicative of the midpoint of the output voltage. The pulse width of the point A in FIG. 3 shows a pulse width in this case.

When the comparator circuit 203 binarizes the output voltage of the amplifier 202 by using the midpoint of the output voltage of the amplifier 202 as a threshold value, the comparator circuit 203 outputs a pulse whose width is wider than that of a pulse of actually supplied light.

In a case where a supplied optical signal is appropriate to the amplifier 202 (signal represented by the point B), the amplifier 202 amplifies the supplied signal without any problem.

In this case, the pulse width of the output voltage of the amplifier 202 is a width between two points (indicated by arrow marks) where the output waveform intersects the line indicative of the midpoint of the output voltage. The pulse width of the point B in FIG. 3 shows a pulse width in this case.

Thereafter, the comparator circuit 203 supplies a digital signal whose pulse width is substantially the same as that of supplied light.

In a case where a supplied optical signal is very small (signal represented by the point C), the amplifier 202 cannot amplify the signal sufficiently.

In this case, the pulse width of the output voltage of the amplifier 202 is a width between two points (indicated by arrow marks) where the output waveform intersects the line indicative of the midpoint of the output voltage. The pulse width of the point C in FIG. 3 shows a pulse width in this case.

Consequently, the output signal of the amplifier 202 is distorted and the comparator circuit 203 cannot carry out binarization at an appropriate midpoint.

It is ideal for the amplifier 202 to amplify a supplied optical signal without changing a waveform of the signal. However, when weak light is supplied, the amplifier 202 outputs a signal having a different waveform from that of the supplied light.

This is because: in an ideal photodiode or an ideal amplifier, a rising time (Tr) and a falling time (Tf) are the same as each other, but in actuality, Tr<Tf and the falling time is longer than the rising time.

Although the relation of Tr<Tf is met regardless of light intensity, the relation is more evident with weak light and high amplification ratio. Consequently, in the case where weak light is supplied, a pulse width becomes long. Furthermore, in the case of weak light, SN ratio drops and therefore a noise is also amplified greatly, resulting in much amount of jitter.

Furthermore, Tr/Tf tends to be large as an amplification ratio increases. Consequently, in the case of weak light, an output signal tends to have slower change in a rising pulse compared with a transmitted optical input.

Note that, in the light-receiving section 101, the process from reception of light to supply of a digital signal to the outside of the light-receiving section was explained with positive logic. However, the positive logic may be converted into negative logic in any circuit from the photodiode 201 to the drive circuit 204.

As described above, the light-receiving sections 101 to 103 receive optical signals, convert the optical signals into electric signals, and supply the electric signals as digital signals to the reception circuit 111 which is outside of the light-receiving sections 101 to 103. The reception circuit 111 judges/selects a digital signal to be demodulated out of the digital signals from the light-receiving sections 101 to 103, demodulates the selected digital signal, and supplies the demodulated signal to the CPU or the memory of the receiver 100.

With reference to FIG. 1, the following explains a structure of the reception circuit 111.

The reception circuit 111 includes the demodulation circuit 110 and a data processing circuit 106. The reception circuit 111 is a circuit for a process before a reception signal is supplied to the CPU or the DMA. The reception circuit 111 selects a signal to be demodulated out of supplied signals, demodulates the selected signal, and causes the demodulated signal to be subjected to a data process, and then outputs the signal to the CPU. Alternatively, the reception circuit 111 outputs the demodulated signal directly to the CPU.

The demodulation circuit 110 includes a judgment/selection section 104 (judgment and selection means) and a demodulation section 105 (demodulation means).

The judgment/selection section 104 properly judges/selects a signal to be demodulated out of electric signals converted from optical signals outputted from the reception sections 101 to 103, and the judgment/selection section 104 supplies the signal to the demodulation section 105. The structure and functions of the judgment/selection section 104 will be detailed later.

The demodulation section 105 synchronizes the supplied signal so that the signal is converted into a serial pattern and restores (demodulates) the serial pattern into packet data, and outputs the packet data directly to the CPU (arrow mark in the upper part of the reception circuit 111) or to the data processing circuit 106.

The data processing circuit 106 restores reception data from the packet data. When the CPU receives the packet data from the demodulation section 105, the CPU restores the reception data, and processes it or stores it in the memory. On the other hand, when the CPU receives data from the data processing circuit 106, the CPU processes the data or stores the data in the memory.

As described above, the CPU may receive data from the demodulation section 105 or directly from the data processing circuit 106. Furthermore, DMA may be used for data transfer.

As described above, transmission/reception of data is performed between the transmitter 10 and the receiver 100. Here, in order that data is restored by the receiver 100 without any problem and data reception is completed, it is necessary to properly demodulate digital signals obtained from optical signals received by the light-receiving sections 101 to 103.

Figure 5:
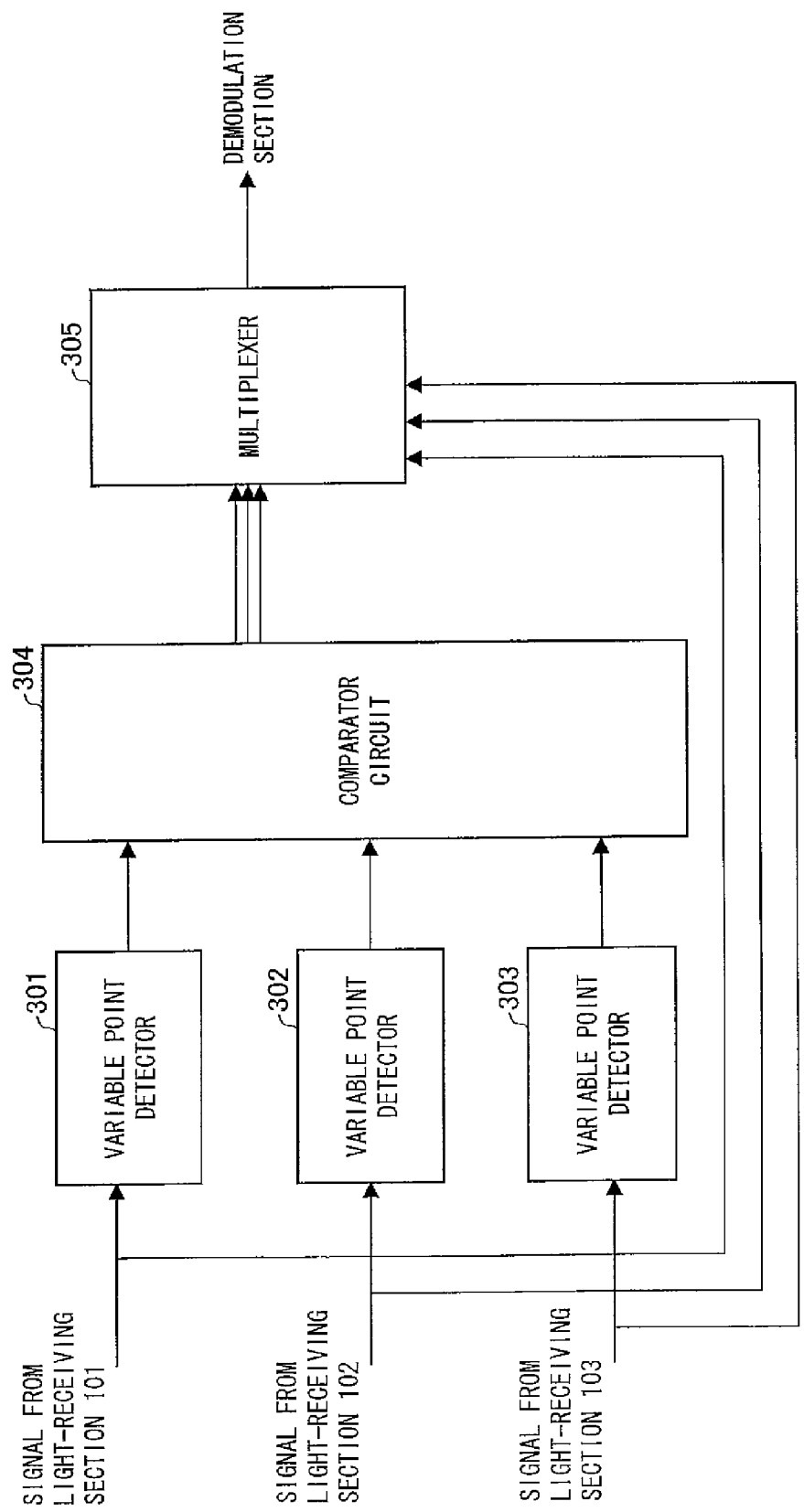
FIG. 5 is a block diagram showing a structure of a judgment/selection section of the demodulation circuit.

With reference to FIG. 5, the following explains a structure of the judgment/selection section 104 of the demodulation circuit 110. The judgment/selection section 104, which is a feature of the present embodiment, judges and selects a digital signal to be demodulated.

FIG. 5 is a block diagram showing a structure example of the judgment/selection section 104.

As shown in FIG. 5, the judgment/selection section 104 includes variable point detectors 301 to 303, a comparator circuit 304, and a multiplexer 305. The judgment/selection section 104 judges/selects a signal to be demodulated out of signals from the light-receiving sections 101 to 103, and supplies the signal to the demodulation section 105.

The variable point detectors 301 to 303 detect variable points at which supplied digital signals change their states, that is, timing with which High level and Low level of a pulse are switched. Specifically, the variable point detectors 301 to 303 detect, along a temporal axis, a time at which a pulse of a supplied digital signal rises from Low to High. In the case of negative logic, the variable point detectors 301 to 303 detect a time at which a pulse of a supplied digital signal falls from High to Low.

The variable point detectors 301 to 303 are connected with the light-receiving sections 101 to 103, respectively. When the variable point detectors 301 to 303 detect rising of a pulse at the light-receiving sections 101 to 103, the variable point detectors 301 to 303 supply detection signals to the comparator circuit 304. As the number of the light-receiving sections increase, the number of the variable point detectors increase accordingly.

The comparator circuit 304 compares the signals supplied from the variable point detectors 301 to 303 and supplies, to the multiplexer 305, a signal indicative of a signal whose pulse changes at the earliest time out of the compared signals. Specifically, a signal corresponding to a supplied signal whose timing of pulse change detected by the variable point detectors 301 to 303 is the earliest is supplied to the multiplexer 305.

For example, assume that a signal supplied from the variable point detector 301 is supplied at the earliest time out of signals supplied from the variable point detectors 301 to 303. At that time, a signal instructing the multiplexer 305 to select a digital signal supplied to the variable point detector 301 is supplied to the multiplexer 305.

Further, the comparator circuit 304 judges and selects a signal having changed at the earliest time out of signals whose rising of pulses are detected by the variable point detectors 301 to 303, and maintains the selected signal until pulses of all the signals fall.

The multiplexer 305 selects a signal corresponding to the supplied signal and causes the selected signal to pass through the multiplexer 305. That is, an output signal from the comparator circuit 304 and output signals from the light-receiving sections 101 to 103 are supplied to the multiplexer 305. The multiplexer 305 causes one of the output signals from the light-receiving sections 101 to 103 to pass through the multiplexer 305 and to be supplied to the demodulation section 105, in accordance with the output signal from the comparator circuit 304.

The following explains a series of operations of the judgment/selection section 104 having the above arrangement. The variable point detectors 301 to 303 serially receive digital signals, that is, pulses, from the light-receiving sections 101 to 103. When a pulse changes from Low to High, the variable point detectors 301 to 303 supply a signal indicative of the change to the comparator circuit 304. For example, the variable point detectors 301 to 303 supply a signal (1) to the comparator circuit 304.

Subsequently, the comparator circuit 304 selects a signal which is supplied at the earliest time out of signals supplied from the variable point detectors 301 to 303. Thereafter, the comparator circuit 304 supplies a signal indicative of the selection to the multiplexer 305. For example, when an output signal from the variable point detector 301 is supplied at the earliest time, a signal (1, 0, 0) is supplied to the multiplexer 305.

Subsequently, the multiplexer 305 causes one of digital signals from the light-receiving sections 101 to 103 to pass through the multiplexer 305 and to be supplied to the demodulation circuit 105, in accordance with the signal from the comparator circuit 304. For example, when the multiplexer 305 receives the signal (1, 0, 0) from the comparator circuit 304, the multiplexer 305 causes only the digital signal from the light-receiving section 101 to pass through the multiplexer 305 and to be supplied to the demodulation section 105.

Subsequently, when pulses fall, the variable point detectors 301 to 303 switch output signals. For example, the variable point detectors 301 to 303 switch output signals from (1) to (0). Thereafter, the comparator circuit 304 maintains the selected signal till all output signals from the variable point detectors 301 to 303 are switched.

Thereafter, when all signals fall, the comparator circuit 304 is reset from a time when a next pulse is supplied to a time when rising of the pulse is detected.

With reference to FIGS. 1 to 6, the following explains judgment/selection of a signal by the judgment/selection section 104 of the demodulation circuit 110. Specifically, the following explains an example of pulses of digital signals supplied from the light-receiving sections 101 to 103 in a case where, as illustrated in FIG. 1, an optical signal from the transmitter 10 is hardly incident to the light-receiving section 101, is incident to the light-receiving section 102 with high light intensity, and is incident to the light-receiving section 103 with low intensity.

Figure 6:
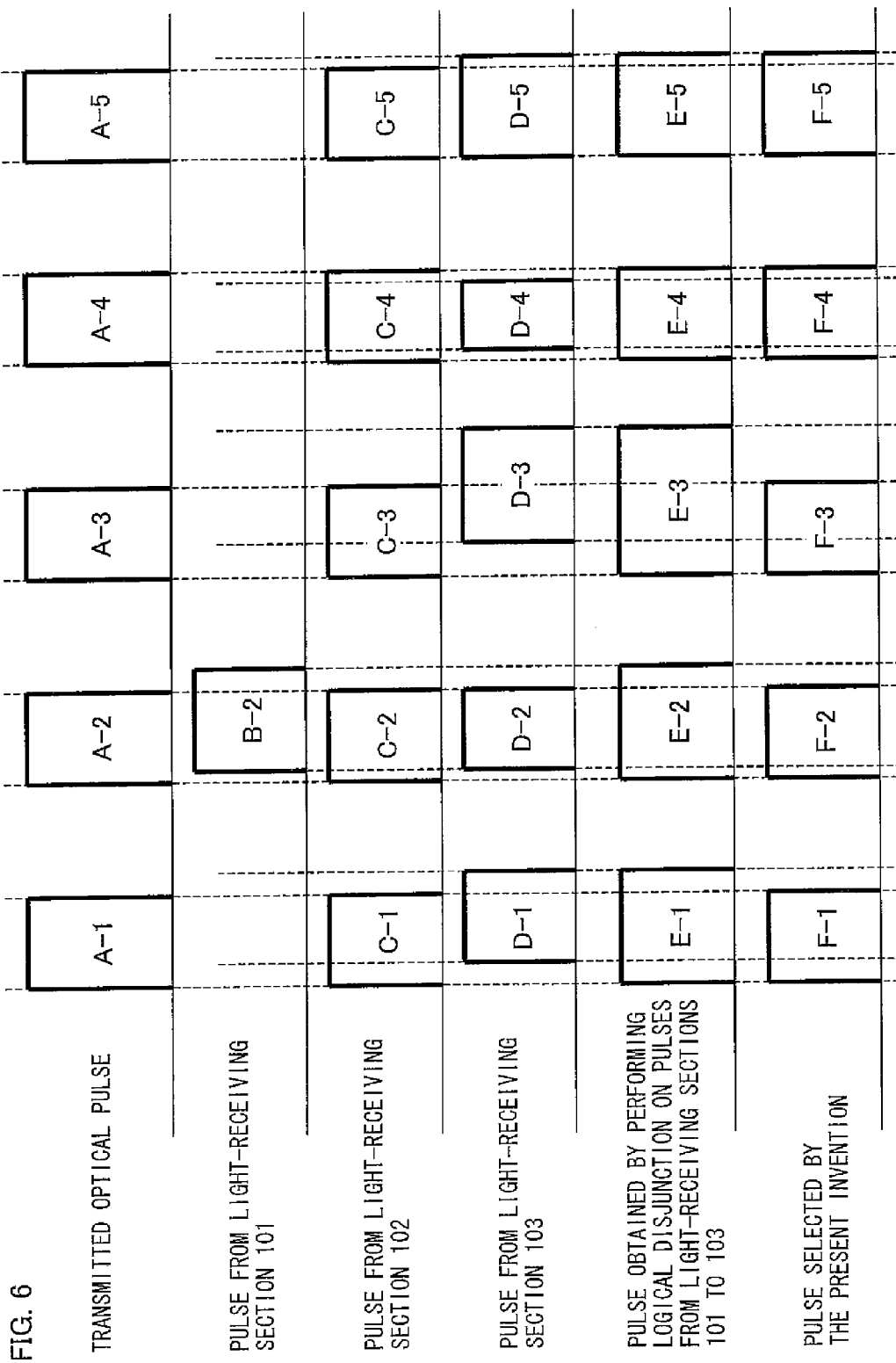
FIG. 6 is a drawing showing output pulses from the light-receiving sections in response to transmitted optical pulses.

FIG. 6 is a drawing showing pulses (output pulses) of digital signals supplied from the respective light-receiving sections in response to pulses (transmitted optical pulses) of transmitted optical signals. The lateral axis indicates a time.

Assume that a pulse train A-1 to A-5 is supplied from the light-emitting section 11 of the transmitter 10 as illustrated in FIG. 6.

As illustrated in FIG. 1, the light-receiving section 101 rarely receives light. Consequently, as illustrated in FIG. 6, a pulse of a transmitted optical signal is hardly supplied as a signal. On rare occasions, the light-receiving section 101 supplies an output pulse B-2 for example to the variable point detector 301.

The light-receiving section 102 receives an optical signal at point B in FIG. 3 for example. That is, the light-receiving section 102 receives relatively strong light. Consequently, as illustrated in FIG. 6, the light-receiving section 102 supplies, to the variable point detector 302, a pulse train C-1 to C-5 corresponding to the optical signal at point B.

The light-receiving section 103 receives an optical signal at point C in FIG. 3 for example. That is, the light-receiving section 103 receives weak light. Consequently, as illustrated in FIG. 6, the light-receiving section 103 supplies, to the variable point detector 303, a pulse train D-1 to D-5 corresponding to the optical signal at point C.

An examination of the pulses of the light-receiving sections 101 to 103 shows that the output pulse of the light-receiving section 103 receiving weak light has a slower variable point where a pulse rises, compared with the output pulse of the light-receiving section 102 receiving strong light.

Further, a pulse signal based on weak light has a low SN ratio and therefore has much jitter components. For that reason, both rising and falling of the output pulses of the light-receiving section 103 receiving weak light greatly vary with respect to the actually transmitted optical pulses.

In a case where only one light-receiving section exists, the modulation section 105 can modulate pulses of a digital signal from the light-receiving section receiving weak light, provided that the pulses have a jitter of a predetermined value or less. Indicator of a jitter being a predetermined value or less is a pulse width for example.

Assume that, when a pulse width in FIG. 3 is between dash-dotted lines, it is possible to demodulate a digital signal including the pulse train. At that time, reference to FIG. 6 shows that the pulse train of the light-receiving section 102 (point B) can be demodulated, whereas the pulse train of the light-receiving section 103 (point C) cannot be demodulated.

Note that, the predetermined value has a permissible value ranging from 0.4 UI to 0.8 UI (UI: Unit Interval. 1 UI indicates the minimum pulse width used in communications. 0.4 UI indicates that deviation of ±0.2 UI is permissible). The predetermined value varies depending on what is mounted on the reception circuit 111. Further, the permissible value varies in accordance with communications methods and full-duplex/half-duplex communications.

Subsequently, the judgment/selection section 104 judges and selects a signal whose pulse rises from Low to High at the earliest time, out of the pulse B-2 from the light-receiving section 101, the pulse train C-1 to C-5 from the light-receiving section 102, and the pulse train D-1 to D-5 from the light-receiving section 103.

Consequently, as illustrated in FIG. 6, the pulse train F-1 to F-5 is selected as pulses to be supplied to the demodulation section 105. The pulse train F-1 to F-5 is substantially the same as the pulses of the light-receiving section 102 (point B) where a pulse rises at the earliest time.

That is, the pulse train F-1 to F-4 is obtained by selecting the pulse train C-1 to C-4, and the pulse F-5 is obtained by selecting the pulse C-5 and the pulse D-5 and performing logical disjunction on C-5 and D-5.

A simple way to demodulate signals from the light-receiving sections 101 to 103 is using the pulse train E-1 to E-5 which is obtained by performing logical disjunction on the signals from the light-receiving sections 101 to 103.

However, when the pulse train E-1 to E-5 is used as pulse signals to be demodulated, pulses to be demodulated have longer pulse widths than those of the signal from the light-receiving section 103 and accordingly the demodulation section 105 cannot demodulate the pulses at all. That is, although a signal which can be demodulated is supplied from the light-receiving section 102 to the demodulation circuit 110, the receiver 100 judges that the signal cannot be received.

As described above, the demodulation circuit 110 of the present embodiment judges and selects a signal whose pulse rises at the earliest time and demodulates the signal, based on a nature that a pulse of a signal of weak light (point C in FIG. 3) which cannot be demodulated is slower in its rising than a pulse of a signal of comparatively strong light (point A or B in FIG. 3).

That is, it is possible to substantially determine intensity of a pulse by detecting a pulse variable point, and therefore it is possible to obtain the most appropriate pulse for demodulation.

For that reason, the demodulation circuit 110 of the present embodiment includes: the judgment/selection section 104 for detecting timing with which a pulse of a digital signal is switched from Low to High and selecting at least one digital signal; and the demodulation section 105 for modulating the digital signal selected by the judgment/selection section 104.

With the arrangement, the judgment/selection section 104 detects risings from Low to High of pulses of digital signals from the light-receiving sections 101 to 103, and the judgment/selection section 104 judges which pulse has risen at the earliest time out of pulses of digital signals from the light-receiving sections 101 to 103. Thereafter, the judgment/selection section 104 selects a digital signal whose pulse has risen at the earliest time out of the digital signals from the light-receiving sections 101 to 103. Consequently, it is possible to select a digital signal to be demodulated with respect to a plurality of digital signals, not with respect to the light-receiving sections 101 to 103.

Consequently, it is possible to select a digital signal which is appropriate for demodulation, that is, which has little jitter components, with respect to a plurality of digital signals. Furthermore, the judgment/selection section 104 selects a digital signal based on timing with which High level and Low level of a pulse signal are switched. This makes it easy to select a digital signal.

Further, as the judgment/selection section 104 selects a digital signal, it is possible for the demodulation section 105 to demodulate the selected digital signal without putting together jitter components which are included in digital signals.

Furthermore, as a digital signal whose pulse has risen at the earliest timing has little jitter components, it is possible to demodulate the selected digital signal more properly.

Consequently, the demodulation circuit 110 of the present embodiment can select a digital signal having little jitter components out of digital signals from the light-receiving sections 101 to 103 and can demodulate the digital signal.

A method to obtain a similar effect is causing a reception circuit including all components to receive all packet data and thereafter checking the packet data using data (FCS: Frame Check Sequence or CRC: Cyclic Redundant Code) attached to the packet data for checking completeness of the packet data, and selecting packet data without errors. At that time, reception circuits and FIFO (First In First Out) are necessary for each device, approximately some ten thousand gate devices are required.

In contrast, the present invention can be realized using some thousand gate devices, resulting in a smaller circuit size.

Further, in the demodulation circuit 110 of the present embodiment, the judgment/selection section 104 selects a signal to be demodulated merely by detecting a pulse variable point of a digital signal. Therefore, it is unnecessary to provide, at a stage prior to the demodulation circuit 110, a circuit for processing a pulse signal so that the pulse signal becomes appropriate for demodulation.

Consequently, it is possible to reduce a delay time from the time when an actual optical signal is supplied (received) to the time when the signal is supplied to the reception circuit 111, so that the delay time becomes only several times longer than a communication unit.

Further, in the demodulation circuit 110 of the present embodiment, as the judgment/selection section 104 identifies a signal to be demodulated with respect to every plurality of pulses, it is possible to smoothly switch devices in a circuit constituting the judgment/selection section 104, even if a source for generating a transmission signal (a transmitter such as a mobile phone) moves in the course of communications. Consequently, it is possible to prevent communication breakdown.

It is difficult for a digital circuit to have temporal axis information endlessly. Therefore, it is necessary to perform sampling with sufficient clock speed.

The demodulation circuit 110 of the present embodiment may be arranged so that: in detecting a variable point of a pulse of a digital signal, the demodulation circuit 110 detects the variable point based on data which is sampled at sufficiently higher clock speed than communication data, and the demodulation circuit 110 selects a pulse.

This arrangement will be explained below with reference to FIG. 7.

Figure 7:
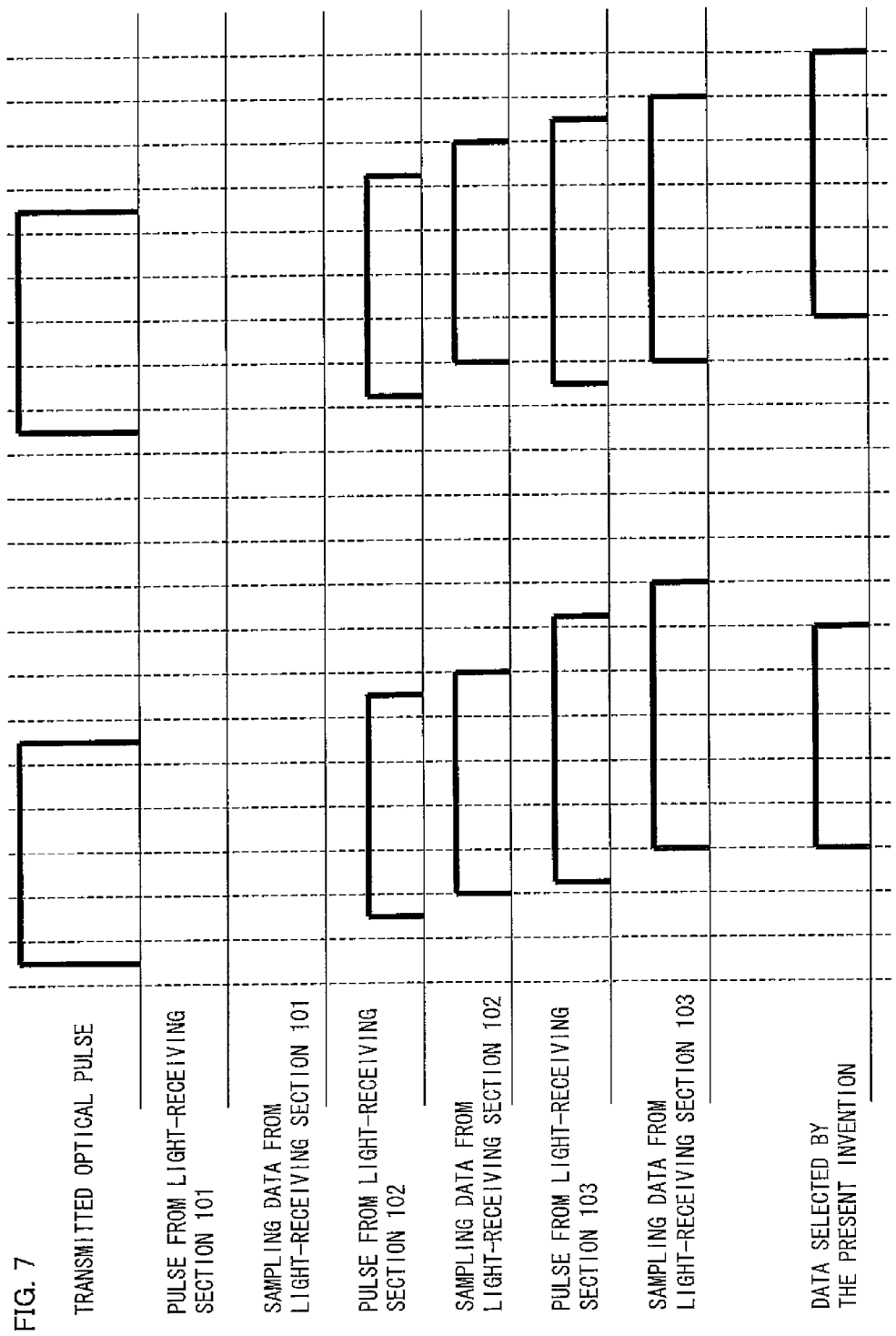
FIG. 7 is a drawing showing sampling data of output pulses from the light-receiving sections in response to transmitted optical pulses.

FIG. 7 is a drawing illustrating sampling data of pulses (output pulses) of digital signals supplied from light-receiving sections in response to pulses (transmitted optical pulses) of transmitted optical signals. The broken lines in a longitudinal direction indicate clock in the receiver 100, and the lateral axis indicates a time. In FIG. 7, a sampling pulse whose clock speed is five times higher than that of a signal pulse is used.

The demodulation circuit 110 of the present embodiment is made of a digital circuit which operates in response to a pulse of a digital signal. Generally, a digital circuit maintains a signal in synchronization with clock. In order that the digital circuit has temporal information, it is necessary for the digital circuit to maintain a signal in synchronization with clock.

A transmitted optical pulse is generated in synchronization with clock of the transmitter 10 and therefore is supplied independently of clock of the receiver 100. In order to establish communications, the clock of the transmitter 10 and the clock of the receiver 100 must be approximate to each other.

Further, as communications become faster, clock accuracy in clock is required to be higher. In a case of communications Baud Rate of some Mbps, clock accuracy is generally required to be ±100 ppm or less. As the clock of the transmitter 10 is independently of the clock of the receiver 100, the clock is expressed as a signal having phase lag. The phase lag changes in accordance with time.

In the receiver 100, the light-receiving section 102 having received an optical signal including transmitted optical pulses supplies, to the demodulation circuit 110, a digital signal having output pulses which are obtained by binarizing the optical signal. The pulses of the output signal are based on the transmitted optical pulses and therefore have timing independently of the clock of the receiver 100.

The judgment/selection section 104 of the demodulation circuit 110 causes sampling functions of the judgment/selection section 104 or the variable point detectors 301 to 303 to sample output signals from the light-receiving sections 101 to 103 in synchronization with the clock of the receiver 100.

Sampling data obtained by the sampling of a signal from the light-receiving section 102 is shown in FIG. 7. Sampling data with respect to the light-receiving section 103 is also shown in FIG. 7.

Subsequently, in the judgment/selection section 104, the variable point detectors 301 to 303 detect timings with which pulses rise from Low to High based on the sampling data shown in FIG. 7, and then the comparator circuit 304 compares the timings.

In FIG. 7, a comparison between (i) sampling data of the light-receiving section 102 which indicates a variable point where the first pulse rises and (ii) sampling data of the light-receiving section 103 which indicates a variable point where the first pulse rises shows that the sampling data of the light-receiving section 102 changes earlier than the sampling data of the light-receiving section 103 by 1 clock. Consequently, the comparator circuit 304 judges that the sampling data of the light-receiving section 102 indicates the earliest pulse variable point, and the comparator circuit 304 selects the sampling data of the light-receiving section 102.

Consequently, the first pulse of data selected by the present invention indicates the sampling data of the light-receiving section 102. Note that, after the pulse is selected, the pulse is generally maintained again in synchronization with clock. Accordingly, the selected data in the present invention is supplied 1 clock later than the sampling data of the light-receiving section 102.

Furthermore, in FIG. 7, sampling data of the light-receiving section 102 which indicates a variable point where the second pulse rises is the same as sampling data of the light-receiving section 103 which indicates a variable point where the second pulse rises. Consequently, the judgment/selection section 104 selects both signals.

Consequently, the second pulse of the data selected by the present invention indicates sampling data of the both signals. However, the sampling data of the light-receiving section 103 indicates a longer pulse than the sampling data of the light-receiving section 102, and therefore a pulse equivalent to the pulse of the light-receiving section 103 is supplied. Although a long pulse is left in the above example, the present invention may be arranged so that a long pulse is stopped from being supplied at the time when a short pulse ends.

As described above, in the demodulation circuit 110 of the present embodiment, for analysis on a temporal axis, the judgment/selection section 104 samples a digital signal based on a clock sufficiently faster than the digital signal and detects timing with which the digital signal switches from Low to High.

The length of a pulse changes due to the sampling. However, the reception circuit is designed to allow a change in the length of a pulse to an extent of approximately the half length of a pulse unit. Accordingly, the reception circuit absorbs a change in a pulse to some extent and modulation of the signal can be performed.

Because a pulse signal as a result of sampling is used, there is a case where it is judged that digital signals from the light-receiving sections 101 to 103 are switched simultaneously. However, when sufficiently fast clock is used, sampled data can be regarded as data considerably similar to the original data. Consequently, selection of a plurality of pulse signals has little influences.

As described above, selection based on data sampled with sufficiently faster clock than communication data results in a sufficiently good effect.

Note that, for convenience of explanation, protection against metastability (protection such as two-stage shift registers without a logic circuit) is not mentioned above. In reality, in order that a signal independent of clock is sampled in synchronization with clock, it is desirable to provide protection against metastability.

An explanation was made above as to a case where the judgment/selection section 104 of the demodulation circuit 110 judges rising of a pulse in a pulse unit. Alternatively, the present invention may be designed such that the judgment/selection section 104 stores differences between variable points of pulses and selects, based on the average of the differences, the light-receiving sections 101 to 103 which output the digital signals.

The demodulation circuit 110 of the present embodiment may be made of ICs. The demodulation circuit 110 has a simple structure including the judgment/selection section 104 and the demodulation section 105, and does not require special devices. Therefore, the demodulation circuit 110 can be easily realized using ICs.

Examples of ICs for realizing the demodulation circuit 110 include: an IC serving solely as a demodulation circuit; and an IC serving solely as a modulation circuit and a demodulation circuit. The examples further include a high-performance IC that includes a CPU, a memory controller, and an external interface such as a USB.

Furthermore, the receiver 100 of the present embodiment may be divided into two devices: a light-receiving device constituted of the light-receiving sections 101 to 103 removed from the receiver 100; and a reception device which is the receiver 100 from which the light-receiving sections 101 to 103 are removed. This allows properly changing the location of the light-receiving device, resulting in proper location of the receiver 100 in accordance with the environment.

For convenience of explanation, an explanation was made as to a case where the transmitter 10 and the receiver 100 only have their respective functions. Alternatively, the transmitter 10 and the receiver 100 may include both transmission and reception functions.

Embodiment 2

With reference to FIGS. 8 to 12, the following explains another embodiment of the present invention. Note that, structures other than those explained in the present embodiment are the same as those in Embodiment 1. For convenience of explanation, members having the same functions as those illustrated in drawings of Embodiment 1 are given the same reference numerals and explanations thereof will be omitted here.

In Embodiment 1, an explanation was made as to a case where the light-receiving section 101 receives very weak light as illustrated in FIG. 1. In the present embodiment, it is assumed that the light-receiving section 101 does not receive an optical signal at all. At that time, as no signal is supplied, the gain of the amplifier 202 of the light-receiving section 101 is at the maximum.

Consequently, there is a case that even a little disturbing noise (such as an electric noise from a device, a variation in power source voltage, and a little change in disturbing light) is amplified and the light-receiving section 101 supplies a signal to the demodulation circuit 110.

The signal based on the disturbing noise is supplied from the light-receiving section 101 to the demodulation circuit 110 independently of an optical signal. Consequently, when signals are supplied to the judgment/selection section 104 of the demodulation circuit 110 of Embodiment 1, there is a case that a desired signal which has been transmitted is not selected, but a signal based on the disturbing noise is falsely selected.

Figure 8:
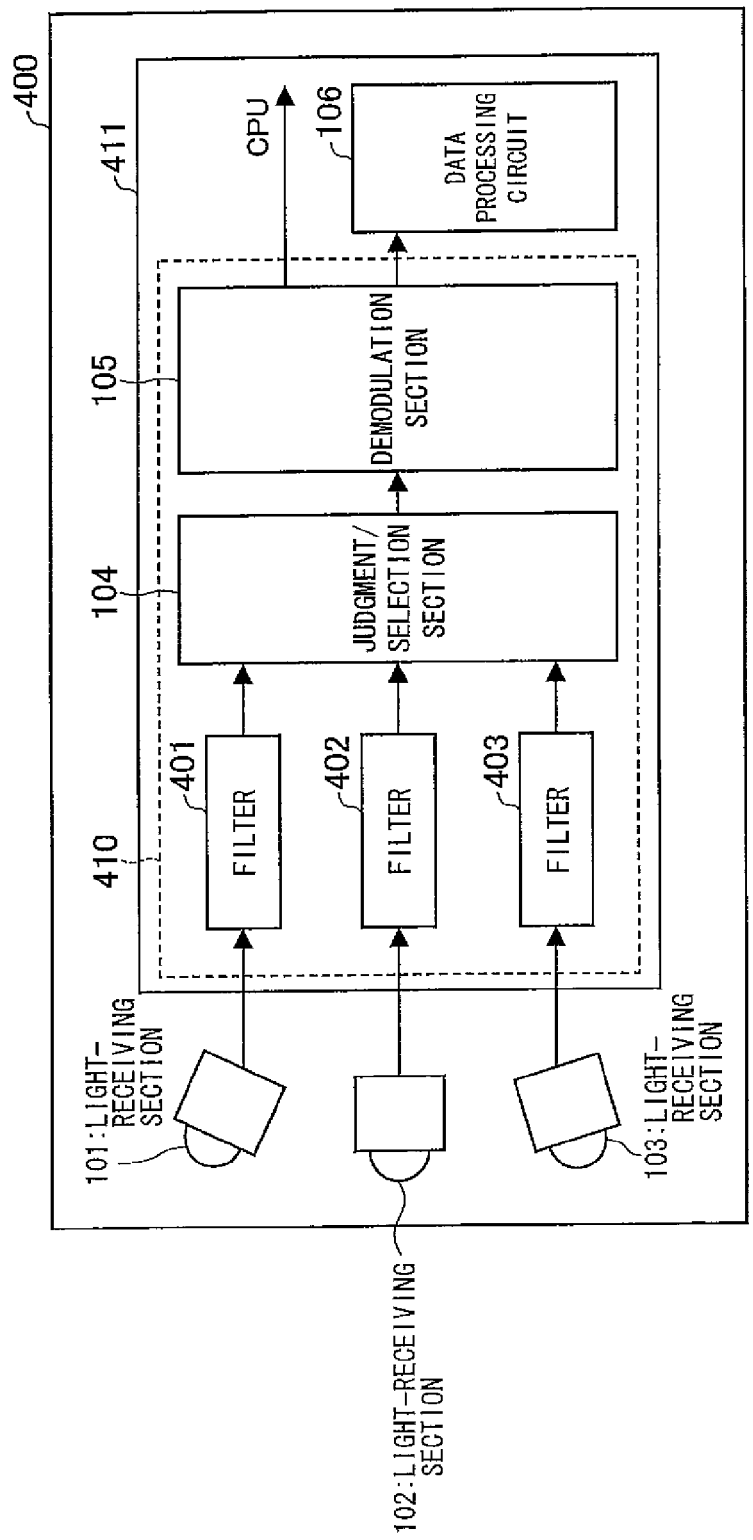
FIG. 8 is a block diagram showing a structure of a receiver including a demodulation circuit of another embodiment of the present invention.

In contrast, as illustrated in FIG. 8, a demodulation circuit 410 of the present embodiment includes filters 401 to 403 at a stage prior to the judgment/selection section 104. The filters 401 to 403 cut signals which are considered to be different from communication signals out of signals from the light-receiving sections 101 to 103.

FIG. 8 is a block diagram illustrating an example of a structure of a receiver 400 including the demodulation circuit 410.

The receiver 400 of the present embodiment includes the demodulation circuit 410 instead of the demodulation circuit 110 of the receiver 100 of Embodiment 1. The demodulation circuit 410 of the present embodiment includes the filters 401 to 403 (noise removing means) as well as the structure of the demodulation circuit 110 of Embodiment 1.

The filters 401 to 403 remove supplied pulse signals in accordance with necessity. According to purposes, the filters are classified into: a pulse width filter for filtering a pulse in line with the width of the pulse; and a pulse interval filter for checking the interval of pulses and regarding a pulse as a noise and removing the pulse depending on a situation in which the pulse is supplied; etc.

Figure 9:
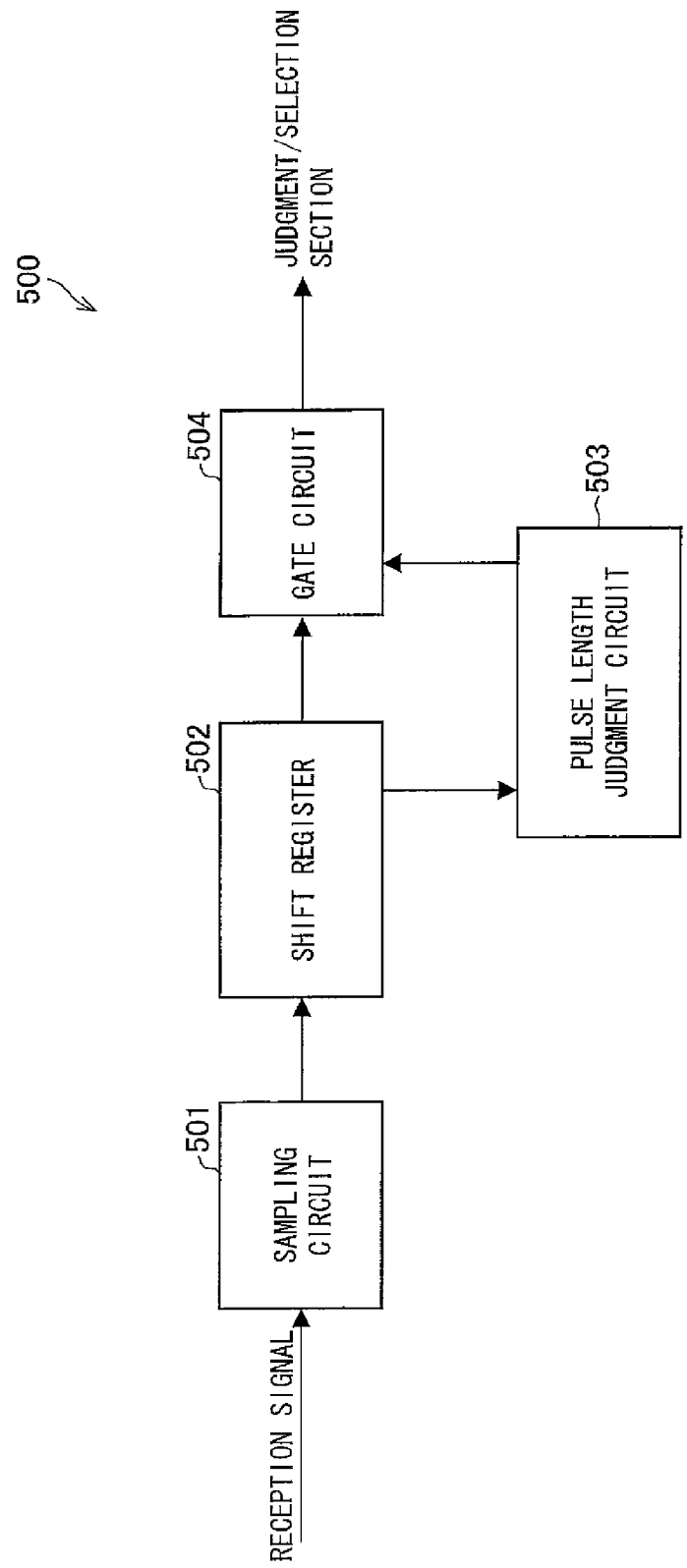
FIG. 9 is a block diagram showing a structure of a pulse width filter in the demodulation circuit.
Figure 10:
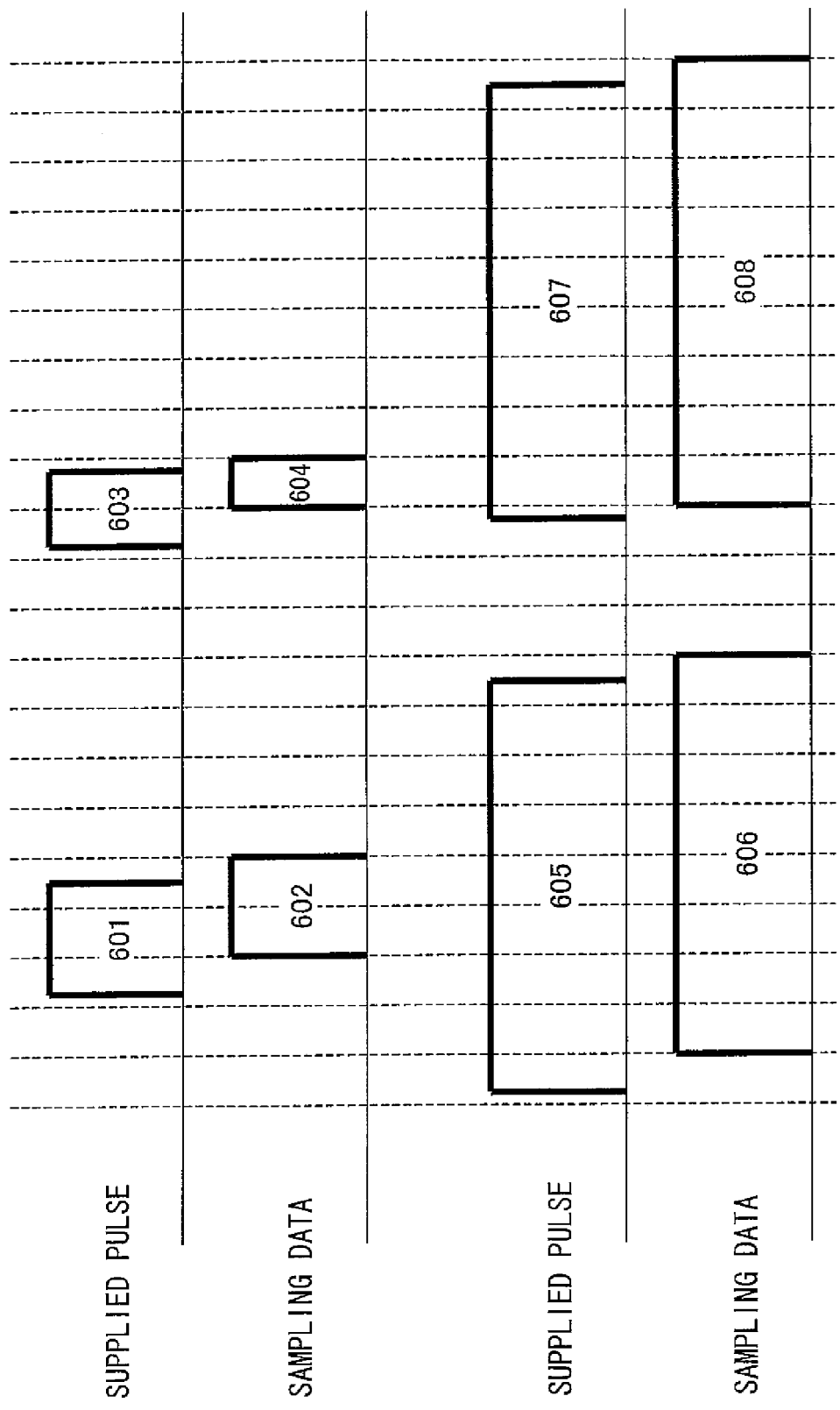
FIG. 10 is a drawing showing input pulses and sampling data.

With reference to FIGS. 8 to 10, the following explains a case where the filters 401 to 403 of the demodulation circuit 410 are the pulse width filters.

FIG. 9 is a block diagram illustrating an example of a structure of a pulse width filter circuit 500 for realizing the pulse width filter. FIG. 10 is a drawing illustrating input pulses and sampling data, explaining a function of the pulse width filter.

The pulse width filter circuit 500 (pulse width filter) is a digital circuit for realizing the pulse width filter. The pulse width filter is preferably made of a digital circuit. Generally, the pulse width filter performs sampling at a sufficiently higher clock speed compared with communication signals.

As illustrated in FIG. 9, the pulse width filter circuit 500 includes a sampling circuit 501, a shift register 502, a pulse length judgment circuit 503, and a gate circuit 504. Each of the filters 401 to 403 includes the pulse width filter circuit 500.

The sampling circuit 501 samples input pulses.

The shift register 502 holds sampling data supplied from the sampling circuit 501. Specifically, the shift register 502 is designed to be capable of holding sampling data whose length is at the maximum within a range allowing the data to pass through the gate circuit 504.

The pulse length judgment circuit 503 judges the length of the sampling data from the shift register 502.

The gate circuit 504 allows or does not allow the sampling data from the shift register 502 to pass through the gate circuit 504 in accordance with an output signal from the pulse length judgment circuit 503.

For example, assume a case where communication data is constituted of only 1 UI (Unit Interval) or 2 UI. When sampling data has a length less than 0.5 UI, the gate circuit 504 does not allow a pulse to pass through the gate circuit 504 at the time when the pulse enters the gate circuit 504. When the sampling data has a length of 2.5 UI or more, the gate circuit 504 does not allow a pulse to pass through the gate circuit 504 from a time when the sampling data enters the gate circuit 504 to a time when the pulse ends. That is, the gate circuit 504 allows only a pulse having a predetermined length to pass through the gate circuit 504.

For that reason, the pulse width filter is a filter required to allow only a pulse having a predetermined length to pass through the pulse width filter. Here, the predetermined length is not less than "the minimum pulse length used in communications−0.5 UI" and less than "the maximum pulse length used in communications+0.5 UI".

For example, in a case where only one pulse is used or two continuous pulses are used in communications, a width of a pulse allowed to pass ranges from 0.5 UI to 2.5 UI.

It follows that, in theory, a standard for judging whether a pulse has a length of 1 UI or 2 UI exists in whether the pulse has a length of less than 1.5 UI or a length of not less than 1.5 UI. In other words, when a pulse has a length of less than 1.5 UI, the pulse is regarded as a pulse of 1 UI. When a pulse has a length of not less than 1.5 UI, the pulse is regarded as a pulse of 2 UI.

That is, in theory, a pulse width is allowed to vary in the scope of half of the length of the pulse. A pulse of 1 UI is a pulse whose pulse width is more than 0.5 UI and less than 1.5 UI. A pulse of 2 UI is a pulse whose pulse width is more than 1.5 UI and less than 2.5 UI.

With reference to FIG. 10, the following explains the pulse width filter with examples.

The pulse width filter circuit 500 performs sampling at a clock speed sufficiently higher than a communication signal. In FIG. 10, assume that communication pulses are sampled at a clock speed 5 times higher than that of communication signals and only a pulse of 1 UI is used in communications. At that time, pulses whose pulse width ranges from 2.5 units (clock unit) to 7.5 units are allowed to pass.

When the sampled signal has a length of 2 units (602), an actual length of an input pulse (601) corresponds to 1 unit to 3 units. As it is necessary to allow a pulse of 2.5 units or more to pass, the pulse width filter circuit 500 allows a pulse of 2 units (602) to pass.

When the sampled signal has a length of 1 unit, an actual length of an input pulse (603) corresponds to less than 2 units. As it is necessary to cut a pulse of less than 2.5 units, the pulse width filter circuit 500 cuts a pulse of 1 unit (604).

When the sampled signal has a length of 8 units (606), an actual length of an input pulse (605) corresponds to 7 units to 9 units. As it is necessary to allow a pulse of less than 7.5 units to pass, the pulse width filter circuit 500 allows a pulse of 8 units (606) to pass.

When the sampled signal has a length of 9 units (608), an actual length of an input pulse (607) corresponds to 8 units to 10 units. As it is necessary to cut a pulse of 7.5 units or more, the pulse width filter circuit 500 cuts a pulse of 9 units (608).

As described above, in a case where the minimum pulse unit is 5 and the maximum pulse length is 5, the pulse width filter of the present embodiment cuts sampling data of the pulse of 1 unit and sampling data of the pulse of 9 units or more.

The demodulation circuit 410 of the present embodiment includes the pulse width filter for comparing a pulse width of a pulse signal supplied to the demodulation circuit 410 with a pulse width of a pulse signal generated in response to an optical signal which may be a communication signal, thereby removing a pulse signal other than a pulse signal having a predetermined length. This allows only a pulse having a predetermined length to pass. Consequently, it is possible to remove a noise.

Figure 11:
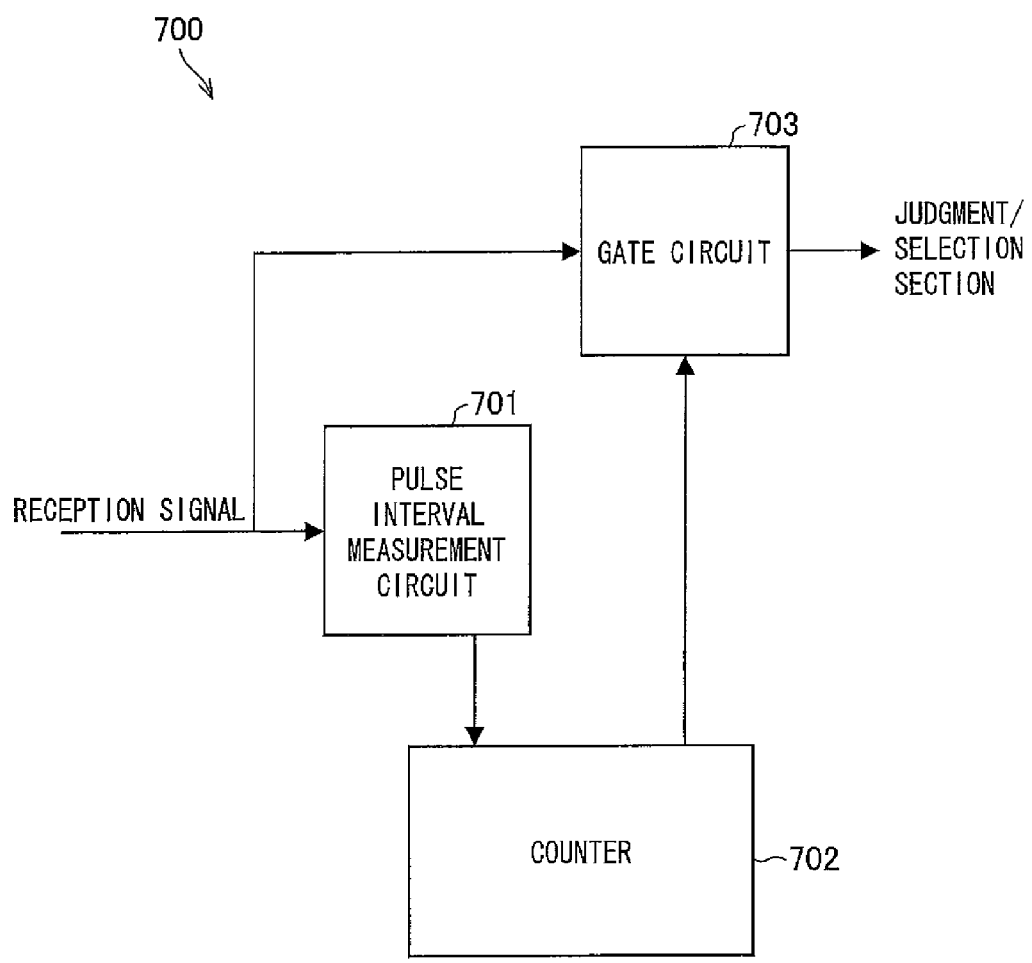
FIG. 11 is a block diagram showing a structure of a pulse interval filter in the demodulation circuit.

With reference to FIGS. 8, 11, and 12, the following explains a case where each of the filters 401 to 403 of the demodulation circuit 410 includes a pulse interval filter.

FIG. 11 is a block diagram illustrating an example of a structure of a pulse interval filter circuit 700 for realizing the pulse interval filter. FIG. 12 is a drawing for explaining a function of the pulse width filter, illustrating intervals at which input pulses are generated. The lateral axis indicates a time.

Specifically, the pulse interval filter checks an interval between pulses, and when receiving no pulse within an interval including a possible pulse interval in communications and a pulse width corresponding to one or more pulses, the pulse interval filter regards the input pulses as noises. Here, the pulse width corresponding to one or more pulses is provided as a margin prepared for jitters and some kind of changes.

The pulse interval filter circuit 700 (pulse interval filter) is a digital circuit for realizing the pulse interval filter. As illustrated in FIG. 11, the pulse interval filter circuit 700 includes a pulse interval measurement circuit 701, a counter 702, and a gate circuit 703.

The pulse interval measurement circuit 701 measures the interval of pulses of a received signal. Specifically, when a pulse is supplied within an interval including a possible pulse interval in communications and a pulse width corresponding to one pulse, the pulse interval measurement circuit 701 supplies, to the counter 702, a signal for incrementing the counter 702. When a pulse is not supplied within the interval, the pulse interval measurement circuit 701 supplies, to the counter 702, a signal for resetting the counter 702.

The counter 702 is incremented or reset in accordance with the signal from the pulse interval measurement circuit 701. When the counting amounts to a predetermined number, the counter 702 supplies a signal serving as an instruction to the gate circuit 703.

When receiving the instruction (output signal) from the counter 702, the gate circuit 703 allows pulses of digital signals from the light-receiving sections 101 to 103 to pass through the gate circuit 703.

With reference to FIG. 12, the following explains with examples a case where the pulse interval filter receives pulses.

In a case [a-1] of receiving four pulses for example within a predetermined interval, the pulse interval filter considers that a signal including the pulses is received and allows subsequent pulses to pass.

In a case [a-2] of receiving no pulses within the predetermined interval, the pulse interval filter considers supplied pulses as noises and does not allow the pulses to pass.

In a case [a-3] where the pulse interval filter once allows pulses to pass and thereafter does not receive pulses within the predetermined interval, the pulse interval filter cuts a supplied signal and does not allow the signal to pass until receiving a predetermined number of pulses at the predetermined interval.

As described above, when receiving a predetermined number of pulses at a predetermined interval, the pulse interval filter of the present embodiment considers that subsequent pulses are that of a signal and allows the pulses to pass.

Therefore, the demodulation circuit 410 of the present embodiment includes the pulse interval filter for measuring intervals and numbers of pulses supplied to the demodulation circuit 410 and when receiving a predetermined number of pulses at a possible pulse interval in communications, allowing pulses subsequent to the reception to pass. Consequently, only a signal whose pattern of supplied pulses is similar to an interval in communications is allowed to pass, and other noises are prevented. That is, only a signal considered to be a communication signal is allowed to pass, and a pulse signal excellent as a communication signal without noises can be obtained.

Further, the pulse interval filter is effective in a case where a communication signal includes a signal such as a preamble for synchronization with an optical device or a demodulation circuit.

Further, when the pulse interval filter allows pulse signals to pass therethrough and intervals between the pulse signals become intervals that are not used in communications, the pulse interval filter stops a subsequent pulse signal to pass therethrough. Consequently, even if noises are generated during a time when the pulse interval filter allows pulse signals to pass therethrough, the pulse interval filter can block the pulse signals. Consequently, even if noises are generated during a time when the pulse interval filter allows pulse signals to pass, the pulse interval filter can prevent subsequent pulse signals to pass.

In reality, it is rare that four continuous pulses of a noise signal come with timing allowing the noise signal to be misunderstood as communications. Furthermore, as the number of pulses whose pulse interval is to be measured increases, the number of pulses to be removed increases, resulting in lower efficiency. For that reason, the present invention is designed such that the number of pulses whose pulse interval is to be measured is set to be four or so, and pulses are allowed to pass when the pulse interval filter receives four or so pulses. This assures good result.

Furthermore, when a supplied signal is caused to pass through the pulse width filter and then to pass through the pulse interval filter, it is possible to measure a pulse interval after cutting a signal whose pulse width is not considered to be that of a signal. This assures better filter characteristics.

The present invention is not limited to the above embodiments, and a variety of modifications are possible within the scope of the following claims, and embodiments obtained by combining technical means respectively disclosed in the above embodiments are also within the technical scope of the present invention.

The modulation circuit, the receiver, and the transmitter/receiver of the present invention are applicable to optical communications. Further, the modulation circuit, the receiver, and the transmitter/receiver of the present invention are applicable to ICs having optical communications functions and to TVs, projectors, printers, and recording apparatuses such as DVD recorders and HDD recorders having optical communications functions.

As described above, the demodulation circuit of the present invention includes: judgment and selection means for detecting timing with which High level and Low level of each of the pulse signals are switched and for selecting at least one pulse signal based on the timing; and demodulation means for demodulating the pulse signal selected by the judgment and selection means.

Consequently, it is possible to select a pulse signal to be demodulated, not with respect to a plurality of light-receiving sections, but with respect to a plurality of pulse signals. This allows selecting a pulse signal whose jitter component is small, that is, a pulse signal appropriate for demodulation with respect to the plurality of pulse signals. Further, because the judgment and selection means selects a pulse signal based on timing with which High level and Low level of a pulse signal are switched, it is possible to easily select a pulse signal.

Thus, the demodulation circuit easily capable of selecting and demodulating a signal whose jitter component is small out of a plurality of input signals is provided.

Further, it is desirable to arrange the demodulation circuit of the present invention so that the judgment and selection means selects, out of the pulse signals, a pulse signal whose High level and Low level are switched with earliest timing.

The pulse signal whose High level and Low level are switched with earliest timing has smaller jitter component than other pulse signals. For that reason, with the arrangement, because the judgment and selection means selects, out of the pulse signals, a pulse signal whose High level and Low level are switched with earliest timing, the demodulation means can demodulate a signal having the smallest jitter.

Further, it is desirable to arrange the demodulation circuit of the present invention so that the judgment and selection means samples the pulse signals so as to obtain a pulse signal as a result of the sampling, and the judgment and selection means detects timing with which High level and Low level of the pulse signal are switched.

With the arrangement, the length of a pulse changes due to the sampling. However, the demodulation circuit is designed to allow a change in the length of a pulse to an extent of approximately the half length of a pulse unit. Accordingly, the demodulation circuit absorbs a change in a pulse to some extent and modulation of the signal can be performed.

Because a pulse signal as a result of sampling is used, there is a case where it is judged that pulse signals from the respective light-receiving sections are switched simultaneously. However, when sufficiently fast clock is used, sampled data can be regarded as data considerably similar to the original data. Consequently, selection of a plurality of pulse signals has little influences.

Further, it is desirable to arrange the demodulation circuit of the present invention so that noise removing means for removing a noise from the pulse signals that are supplied from the light-receiving sections, respectively, is provided at a stage prior to the judgment and selection means.

With the arrangement, noise removing means for removing a noise from the pulse signals that are supplied from the light-receiving sections, respectively, is provided at a stage prior to the judgment and selection means, so that it is possible to prevent a noise from being supplied to the judgment and selection means. Consequently, it is possible to prevent demodulation means to demodulate a noise. As a result, the demodulation circuit has a better performance.

Further, it is desirable to arrange the demodulation circuit of the present invention so that the noise removing means is a pulse width filter for removing, out of the pulse signals, a pulse signal whose pulse width is out of a predetermined range.

With the arrangement, the pulse width filter removes, out of the pulse signals, a pulse signal whose pulse width is out of a predetermined range, thereby removing a noise. Consequently, the judgment and selection means can obtain a good pulse signal without a noise Further, it is desirable to arrange the demodulation circuit of the present invention so that the noise removing means is a pulse interval filter for measuring an interval between pulses and the number of pulses of the pulse signals, and when receiving a predetermined number of pulses at a predetermined interval, allowing a pulse signal after the reception to pass through the pulse interval filter.

With the arrangement, the pulse interval filter measures an interval between pulses and the number of pulses of the pulse signals, and when receiving a predetermined number of pulses at a predetermined interval, allowing a pulse signal after the reception to pass through the pulse interval filter, thereby blocking a noise. Consequently, the judgment and selection means can obtain a good pulse signal without a noise.

Further, it is desirable to arrange the demodulation circuit of the present invention so that, in a case where the pulse interval filter allows the pulse signals to pass therethrough, when an interval between pulses of the pulse signals becomes an interval that does not exist in communications, the pulse interval filter blocks a subsequent pulse signal.

With the arrangement, in a case where the pulse interval filter allows the pulse signals to pass therethrough, when an interval between the pulses of the pulse signals becomes an interval that does not exist in communications, the pulse interval filter blocks a subsequent pulse signal. Consequently, even if a noise is generated during a time when the pulse interval filter allows a pulse signal to pass therethrough, the pulse interval filter can block the pulse signal after the generation of the noise. Consequently, even if a noise is generated during a time when the pulse interval filter allows a pulse signal to pass therethrough, the pulse interval filter stops the pulse signal from passing therethrough.

Further, it is desirable to arrange the demodulation circuit of the present invention so that the pulse interval filter receives a pulse signal having passed through a pulse width filter for removing, out of the pulse signals, a pulse signal whose pulse width is out of a predetermined range.

With the arrangement, the pulse interval filter receives a pulse signal having passed through a pulse width filter for removing, out of the pulse signals, a pulse signal whose pulse width is out of a predetermined range. Thus, the pulse interval filter measures a pulse interval and the number of pulse signals from which a noise detected based on a pulse width has been removed. When the pulse interval filter receives a predetermined number of pulses with predetermined intervals, the pulse interval filter allows a pulse signal after the reception to pass through the pulse interval filter. Consequently, it is possible to obtain a better pulse signal without a noise, resulting in further increase in filtering characteristics.

Further, it is desirable that the communication device of the present invention includes a light-emitting section for emitting an optical signal.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A demodulation circuit, connected with a plurality of light-receiving sections each for receiving an optical signal and converting the signal into a binary pulse signal, operable to select and demodulate a pulse signal out of pulse signals that are supplied from the light-receiving sections, respectively, said demodulation circuit comprising:
judgment and selection means for detecting timing with which High level and Low level of each of the pulse signals are switched and for selecting at least one pulse signal based on the timing; and
demodulation means for demodulating the pulse signal selected by the judgment and selection means.

2. The demodulation circuit as set forth in claim 1, wherein the judgment and selection means selects, out of the pulse signals, a pulse signal whose High level and Low level are switched with earliest timing.

3. The demodulation circuit as set forth in claim 2, wherein the judgment and selection means samples the pulse signals so as to obtain a pulse signal as a result of the sampling, and the judgment and selection means detects timing with which High level and Low level of the pulse signal are switched.

4. The demodulation circuit as set forth in claim 1, wherein noise removing means for removing a noise from the pulse signals that are supplied from the light-receiving sections, respectively, is provided at a stage prior to the judgment and selection means.

5. The demodulation circuit as set forth in claim 4, wherein the noise removing means is a pulse width filter for removing, out of the pulse signals, a pulse signal whose pulse width is out of a predetermined range.

6. The demodulation circuit as set forth in claim 4, wherein the noise removing means is a pulse interval filter for measuring an interval between pulses and the number of pulses of the pulse signals, and when receiving a predetermined number of pulses at a predetermined interval, allowing a pulse signal after the reception to pass through the pulse interval filter.

7. The demodulation circuit as set forth in claim 6, wherein, in a case where the pulse interval filter allows the pulse signals to pass therethrough, when an interval between pulses of the pulse signals becomes an interval that does not exist in communications, the pulse interval filter blocks a subsequent pulse signal.

8. The demodulation circuit as set forth in claim 6, wherein the pulse interval filter receives a pulse signal having passed through a pulse width filter for removing, out of the pulse signals, a pulse signal whose pulse width is out of a predetermined range.

9. An IC, comprising a demodulation circuit which is connected with a plurality of light-receiving sections each for receiving an optical signal and converting the signal into a binary pulse signal and which is operable to select and demodulate a pulse signal out of pulse signals that are supplied from the light-receiving sections, respectively, said demodulation circuit including:
judgment and selection means for detecting timing with which High level and Low level of each of the pulse signals are switched and for selecting at least one pulse signal based on the timing; and
demodulation means for demodulating the pulse signal selected by the judgment and selection means.

10. A communication device, comprising:
a plurality of light-receiving sections each for receiving an optical signal and converting the signal into a binary pulse signal; and
a demodulation circuit which is connected with the light-receiving sections and which is operable to select and demodulate a pulse signal out of pulse signals that are supplied from the light-receiving sections, respectively,
said demodulation circuit including:
judgment and selection means for detecting timing with which High level and Low level of each of the pulse signals are switched and for selecting at least one pulse signal based on the timing; and
demodulation means for demodulating the pulse signal selected by the judgment and selection means.

11. The communication device as set forth in claim 10, further comprising a light-emitting section for emitting an optical signal.

* * * * *